United States Patent [19]

Hirata

[11] Patent Number: 5,145,792

[45] Date of Patent: Sep. 8, 1992

[54] METHOD OF FABRICATING A SEMICONDUCTOR OPTICAL DEVICE

[75] Inventor: Takaaki Hirata, tokyo, Japan

[73] Assignee: Optical Measurement Technology Development Co., Ltd., Musashino, Japan

[21] Appl. No.: 799,779

[22] Filed: Nov. 27, 1991

Related U.S. Application Data

[63] Continuation of Ser. No. 451,971, Dec. 20, 1989, abandoned.

[30] Foreign Application Priority Data

| May 23, 1988 [JP] | Japan | 1-129343 |
| Dec. 21, 1988 [JP] | Japan | 63-32467 |

[51] Int. Cl.$^5$ .................................. H01L 21/20
[52] U.S. Cl. ............................ 437/129; 437/133; 372/43; 372/46; 372/96; 148/DIG. 95; 148/DIG. 84; 357/16; 357/17
[58] Field of Search .............. 437/126, 129, 133, 936; 148/DIG. 84, DIG. 95; 372/43, 46, 47, 48, 44; 357/16, 17

[56] References Cited

U.S. PATENT DOCUMENTS

| 4,654,090 | 3/1987 | Burnham et al. | 437/133 |
| 4,711,010 | 9/1988 | Epler et al. | 437/22 |
| 4,748,132 | 5/1988 | Fukuzawa et al. | 437/25 |
| 4,755,015 | 7/1988 | Uno et al. | 350/96.12 |
| 4,802,182 | 1/1989 | Thornton et al. | 372/45 |
| 4,827,482 | 5/1989 | Towe et al. | 372/44 |
| 4,843,032 | 6/1989 | Tokuda et al. | 437/129 |
| 4,869,568 | 9/1989 | Schinpe | 350/96.12 |
| 4,871,690 | 10/1989 | Holonyale, Jr. et al. | 437/105 |
| 4,872,744 | 10/1989 | Abeles et al. | 357/16 |
| 4,875,216 | 10/1989 | Thornton et al. | 372/46 |
| 4,922,499 | 5/1990 | Nitta et al. | 372/45 |
| 4,922,500 | 5/1990 | Chang-Hasnain et al. | 372/45 |
| 4,933,301 | 6/1990 | Scifres et al. | 437/129 |
| 5,019,519 | 5/1991 | Tanaka et al. | 148/DIG. 84 |
| 5,048,049 | 9/1991 | Amann | 372/96 |
| 5,082,342 | 1/1992 | Wight et al. | 372/44 |
| 5,084,893 | 1/1992 | Sekii et al. | 372/45 |

FOREIGN PATENT DOCUMENTS

| 0231075 | 7/1987 | European Pat. Off. | 437/129 |
| 62-66585 | 3/1980 | Japan . | |
| 01114190 | 5/1988 | Japan | 437/129 |
| 63-255986 | 10/1988 | Japan . | |

OTHER PUBLICATIONS

Suzuki et al. "Fabrication of GaAIAS Window-stripe Multi-quantum-well heterostructure lasers Utilising Zn diffusion-induced alloying", Electronics Letters, vol. 20, No. 9 Apr. 1984, pp. 383-384.

M. Razeghi et al., "Disorder of a GaxInl-xAsyPI--y-InP Quantum Well by Zn Diffusion", Semiconductor Science & Technology, vol. 2, No. 12, Dec. 1987, pp. 793-796.

H. Nakashima et al., "AIGaAS Window Stripe Buried Multiquantum Well Lasers", Japanese Journal of Applied Physics/Part 2, vol. 24, No. 8, Aug. 1985, pp. L647-L649.

Patent Abstracts of Japan, vol. 10, No. 168 (E-411), 14th Jun. 1986, & JP-A-61-018 192 (Hitachi Seisakusto K. K. ) 27-01-1986.

(List continued on next page.)

*Primary Examiner*—Mary Wilczewski
*Attorney, Agent, or Firm*—Cushman, Darby & Cushman

[57] ABSTRACT

A semiconductor optical device having a quantum well structure which can easily integrate plural optical devices of band gaps which are different from each other, and yet can achieve a high coupling coefficient by means of disordering the quantum well structure to form a waveguide region except for the portion which is used as an active region. Non-absorbing edges can be formed on the semiconductor laser on the optically integrated circuits by disordering the facets of the quantum well structure with ion implantation and thermal processing.

3 Claims, 12 Drawing Sheets

OTHER PUBLICATIONS

K. Ishida et al., "Fabrication of Index-Guided AlGaAs Multiquantum Well Lasers with Buried Optical Guide by Si-induced Diordering", Japanese Journal of Applied Physics/Part 2, vol. 25, No. 8, Aug. 1986, pp. L690–L697.

S. Murata, et al., "Spectral Characteristics for a 1.5 $\mu$m DBR Laser with Frequency-Tuning Region", IEEE Journal of Quantum Electronics, vol. QE-23, No. 6, Jun. 1987, pp. 835–838.

H. Blauvelet, et al., "Large optical cavity AlGaAs buired heterostructure window lasers", American Institute of Physics, Appl. Phys. Lett. 40(12), Jun. 15, 1982, pp. 1029–1031.

R. L. Thornton, et al. "High power (2.1 W) 10-stripe AlGaAs laser arrays with Si disordered facet windows", American Institute of Physics, Appl. Phys. Lett. 49(23), 8 Dec. 1986, pp. 1572–1574.

M. Uematsu, et al., "Compositional Disordering of Si-Implanted GaAs/AlGaAs Superlattices by Rapid Thermal Annealing", Japanese Journal of Applied Physics, vol. 26, No. 8, Aug., 1987, pp. L1407-L-1409.

S. Murata, et al., "Over 720 GHz (5.8 nm) Frequency Tuning by a 1.5 $\mu$m DBR Laser with Phase and Bragg Wavelength Control Regions", Electronics Letters, vol. 23, No. 8, 9 Apr. 1987, pp. 403–405.

P. Mei, et al., "Comparative studies of ion-induced mixing of GaAs-AlAs superlattices", American Institute of Physics, Appl. Phys. Lett 52(18), 2 May 1988, pp. 1487–1489.

R. F. Kazarinov, et al., "Narrow-Band Resonant Optical Reflectors and Resonant Optical Transformers for Laser Stabilization and Wavelength Division", IEEE Journal of Quantum Electronics, vol. Qe-23, No. 9, Sep. 1987, pp. 1419–1425.

N. A. Olsson, et al., "Narrow Linewidth 1.5 $\mu$m semiconductor laser with a resonant optical reflector", American Institute of Physics, Appl. Phys. Lett. 51(15), 12 Oct. 1987, pp. 1141–1142.

W. D. Laidig, et al., "Disorder of an AlAs–GaAs superlattice by impurity diffusion", American Institute of Physics, Appl. Phys. Lett. 38(10), 15 May 1981, pp. 776–778.

J. J. Coleman, et al., "Disorder of an AlAs–GaAs superlattice by silicon implantation" American Institute of Physics, Appl. Phys. Lett. 40(10), 15 May 1982, pp. 904–906.

K. Meehan, et al., "Disorder of an $Al_xGa_{1-x}As$–GaAs superlattice by donor diffusion", American institute of Physics, Appl. Phys. Lett. 45(5), 1 Sep. 1984, pp. 549–551.

M. Kawabe, et al., "Effects of Be and Si on disordering of the AlAs/GaAs superlattice", American Institute of Physics, Appl. Phys. Lett 46(9), 1 May 1985, pp. 849–850.

Y. Hirayama, et al., "Compositional Disordering of GaAs–$Al_xGa_{1-x}As$ Superlattice by Ga Focused Ion Beam Implantation and its Application to Submicron Structure Fabrication", Japanese Journal of Applied Physics, vol. 24, No. 7, Jul. 1985, pp. L516–L518.

T. Venkatesan, et al., "Dose-dependent mixing of AlAs-GaAs superlattices by Si ion Implantation", American Institute of Physics, Appl. Phys. Lett. 49(12), Sep. 22, 1986, pp. 701–703.

R. L. Thornton, et al., "Monolithic Waveguide Coupled Cavity Lasers and Modulators Fabricated by Impurity Induced Disordering", IEEE Journal of Lightwave Technology, vol. 6, No. Jun. 1988, pp. 786–792.

J. Werner, et al., "Reduced optical waveguide losses of a partially disordered GaAs/AlGaAs single quantum well laser structure for photonic integrated circuits", American Institute of Physics, Appl. Phys, Lett 53(18), 31 Oct. 1988, pp. 1693–1695.

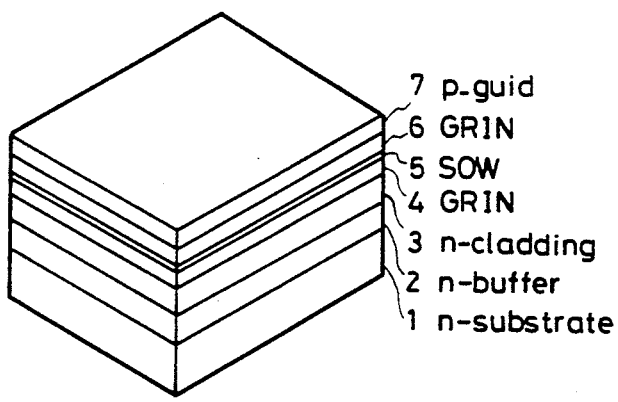
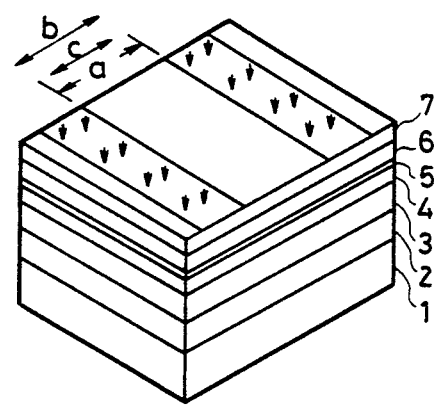
FIG. 6a      FIG. 6b
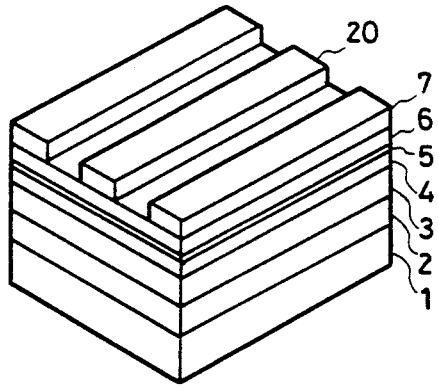
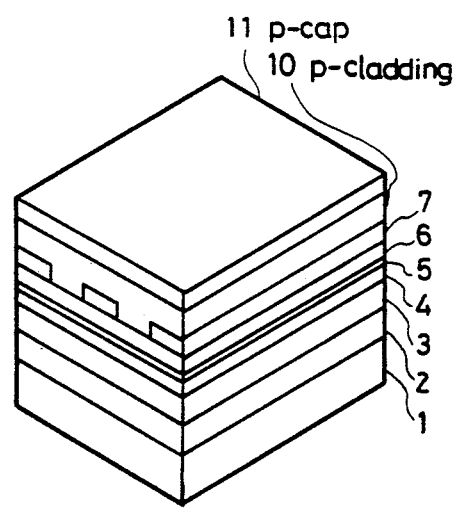
FIG. 6c      FIG. 6d
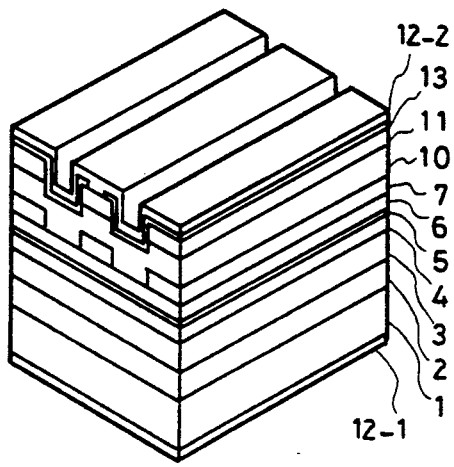
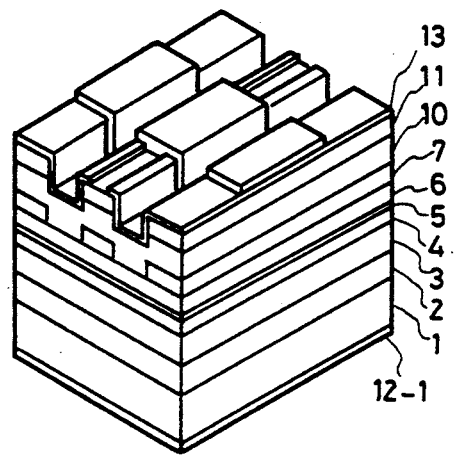
FIG. 6e      FIG. 6f

METHOD OF FABRICATING A SEMICONDUCTOR OPTICAL DEVICE

This is a continuation of application Ser. No. 07/451,971, filed on Dec. 20, 1989, now abandoned.

This invention relates to a semiconductor optical device using a quantum well structure, and more particularly to a semiconductor structure surrounding a quantum well structure.

BACKGROUND

When various optical devices are to be formed on a common substrate to operate with the same frequency band, it is necessary to use semiconductors of different optical characteristics, especially of different band gaps depending on the type of the optical device. Semiconductors of different band gaps are conventionally coupled optically on the same substrate by partially etching a semiconductor thin film which has been epitaxially grown, and by growing another semiconductor of a different band gap thereon. This method has been disclosed, for instance, in S. Murata, I. Mito and K. Kobayashi's paper entitled "Spectral characteristics for a 1.5 μm DBR laser with frequency-tuning region", IEEE Journal of Quantum Electronics, Vol. QE-23, No. 6, June, 1987.

The prior art method is cumbersome as the steps of etching and crystal growing are repeated since the method separately grows semiconductors of different band gaps. Further, it is difficult to grow each of the semiconductor layers flatly. It is also difficult to enhance the coupling coefficient between the devices because the structures of waveguides differ from each other.

When the optical device is a semiconductor laser, it is necessary to reduce optical absorption at the laser facets in order to enhance reliability and increase output power. If optical absorption occurs at the facets, COD (catastrophic optical damage) such as melting of the facets with excessive local heat tends to take place. In order to eliminate optical absorption at the facets, the band gap at the facet should be larger than the band gap at the active region. For this purpose, there have been known the following methods; (1) the facet is etched and buried with a substance having a large band gap, or (2) the change (an increase) of a band gap caused by the disordering of a quantum well structure is used.

Method (1) is described in detail in, for instance, "Large optical cavity AlGaAs buried hetero-structure window lasers" by S. Margalit and A. Yariv; Appl. Phys. Lett. 40 (12), Jun. 15, 1982. Method (2) is described in detail in "High power (2.1 W) 10-stripe AlGaAs laser arrays with Si disordered facet windows" by R. L. Thornton, D. F. Welch, R. D. Burnham, T. L. Paoli and P. S. Cross; Appl. Phys. Lett. 49 (23), Dec. 8, 1982.

However, method (1) above is not quite satisfactory in that the manufacturing process becomes complicated as it is necessary to bury the facet portion of a semiconductor laser. Method (2) is also defective in that as the Si is diffused thermally by contacting Si on the facet, the process should be conducted separately from other semiconductor optical devices, which inevitably makes the manufacturing process complicated. Further, the place where semiconductor laser can be formed is limited on an optical IC.

This invention provides a semiconductor optical device of the structure which is easily manufactured, and which allows integration of a large number of optical devices at a high coupling coefficient, and a manufacturing method therefore. It also provides a method which can easily form a non-absorbing facet on a semiconductor laser.

SUMMARY OF THE INVENTION

The present invention uses an advantageous manufacturing process to form an optical device. This process uses two epitaxy steps, the first of which includes forming semiconductor layers on a substrate and disordering the quantum well over an area larger than a wavelength. The second step imbeds the rib waveguide.

The first aspect of this invention provides a semiconductor optical device which includes on the same substrate an active region comprising a quantum well structure, and a waveguide region to which the output light from the active region is guided, which has a band gap different from that of the active region, and which is characterized in that said waveguide region includes a region where an extension of said quantum well structure is disordered.

The waveguide region as mentioned herein includes not only an optical waveguide but also an optical coupler, a DBR region, a phase control region, a PM modulation region, an AM modulation region, laser facets, etc. where the light radiated from the active region either is transmitted or reflected.

The process which manufactures the semiconductor optical device according provides a method for forming a quantum well structure on a substrate and disordering at least a part of the quantum well structure which is characterized in that the degree of disordering is controlled to set a band gap thereon in a variable fashion.

Disordering may be achieved by ion implantation and thermal processing, and the degree of disordering may be controlled by controlling at least either the dose level or implantation energy. The degree of disordering may also be controlled by properly selecting an implantation ion species.

It is preferable to conduct ion implantation at an earlier stage of the process subsequent to the growth of quantum well structure. More particularly, the method preferably includes the first epitaxy step for growing a semiconductor layer having a quantum well structure on a substrate, and the second epitaxy step for growing another semiconductor layer upon said grown semiconductor layer to form a semiconductor laser structure, and further includes a step of ion implantation after the first epitaxy step but before the second epitaxy step.

If ions are implanted between the two epitaxy steps, as the distance between the ion-implanted surface and the quantum well structure is small at the time of ion implantation, the dose level and implantation energy can be reduced. This can in turn decrease the absorption on the region where ions are implanted.

It is desirable to conduct the guiding layer growth on which a grating or rib waveguide is to be formed in the first epitaxy step and then to implant ions as well as to form the grating or rib waveguide on the layer before the second epitaxy step. It is preferable to conduct the thermal processing with the temperature raised in the second epitaxy step.

In the region where the quantum well structure has been disordered by the aforementioned method, a Bragg reflector region, a frequency tunable Bragg reflector region where reflected frequency is tunable, a resonant optical reflector (hereinafter referred to as ROR) and a frequency tunable ROR region where reflected frequency is tunable may be formed. Facets of a quantum well structure may be disordered by the method similar to the above.

Once the quantum well structure is disordered and the disordering degree progresses, the effective well width is reduced to change the first quantum energy level as well as to increase the band gap. When the structure is fully disordered, the band gap increases up to the value of the barrier layer. Then, the region which has not disordered at all may be used as an active region while the regions which are at least partially disordered may be used as optical waveguides, a DBR region, an ROR region, a phase control region, a PM modulation region, an AM modulation region, etc.

When a facet portion of a quantum well structure is disordered, band gap increases to form a non-absorbing facet. The method according to this invention conducts the step of disordering by ion implantation and thermal processing. By using ion implantation, the region which is to be disordered can be precisely determined so that a non-absorbing facet is formed on a semiconductor laser at an arbitrary position on the substrate.

The semiconductor optical device according to this invention is effective in that optical devices having various and different band gaps may be formed on a substrate without complicated steps in crystal growth because the band gaps can be controlled by the degree of disordering of the quantum well structure. Moreover, it is effective in that the coupling coefficient can be increased as the waveguide structures are the same as in all the regions.

The method may be used for the case where a non-absorbing facet is formed similarly to the manufacturing process of other optical ICs.

BRIEF DESCRIPTION OF THE DRAWINGS

FIGS. 6a-6f are views showing the manufacturing process of the second embodiment of the semiconductor optical device according to this invention where a facet portion of a semiconductor laser is disordered.

DETAILED DESCRIPTION OF THE INVENTION

FIGS. 1a-1h show the manufacturing process of the first embodiment of this invention. In the figures, a GRIN-SCH-SQW (graded index-separate confinement heterostructure single quantum well) structure is used as the quantum well structure, and a substrate is integrated with a frequency tunable DBR laser, an AM modulator and a PM modulator. In this case, disordering is controlled with the dose level in Si ion implantation and the growing process is divided into the first and second epitaxy steps. Ion implantation is conducted after the first epitaxy step, and the temperature increased in the second epitaxy step is used for the thermal processing subsequently to the ion implantation.

Figure 1A:
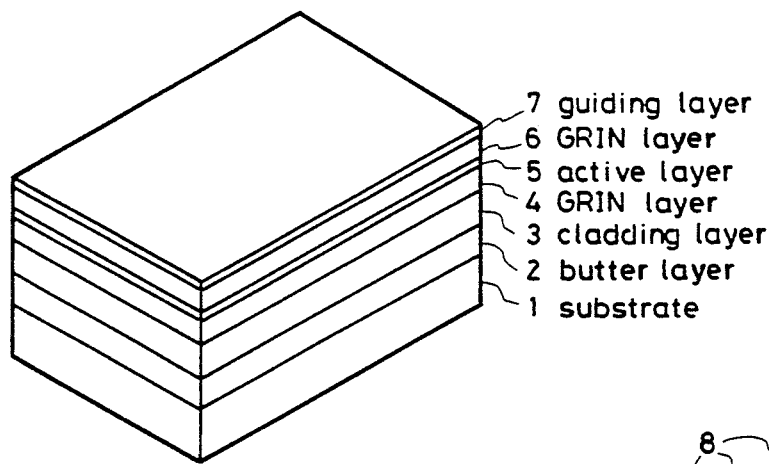
FIGS. 1a-1h are views showing the manufacturing process of an embodiment of the semiconductor optical device according to this invention where a frequency tunable Bragg reflector laser, an AM modulator and a PM modulator are integrated on a substrate.

As shown in FIG. 1a, substrate 1 has sequentially grown on it a buffer layer 2, a cladding layer 3, a GRIN layer 4, an active layer, another GRIN layer 6, and a guiding layer 7. The GRIN layer 4, the active layer 5 and the GRIN layer 6 construct a quantum well structure.

Figure 1B:
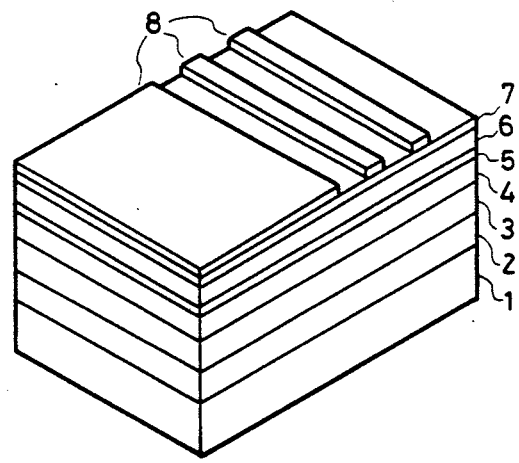
Figure 1C:
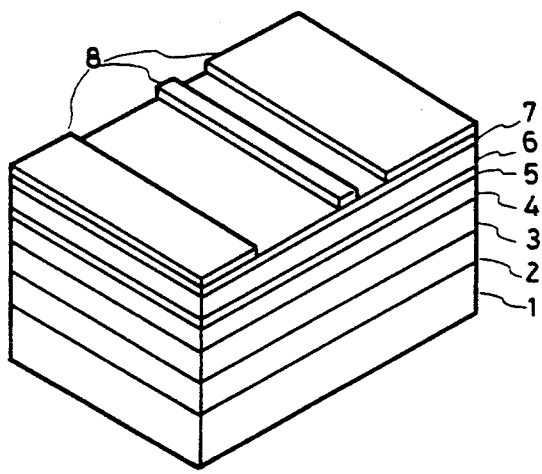
Figure 1D:
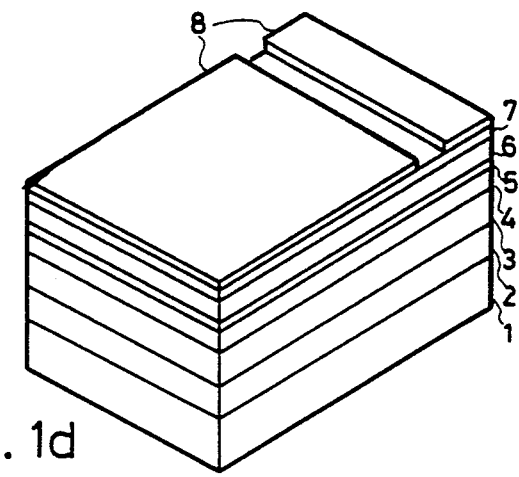

The quantum well structure is disordered by ion implantation and thermal processing. At the time of ion implantation, a mask 8 having a window open on the region where the optical device is to be formed is set on the guiding layer 7 to control the dose level according to the band gap required for the optical device. FIGS. 1b through 1d show the mask shapes for forming a waveguide region for connecting individual optical devices, a refractive index control region for variably controlling refractive index against radiated light and an absorption coefficient control region for variably controlling absorption coefficient against radiated light. Si is used as the implantation ion, and the dose levels for each region are denoted respectively as $S_1$, $S_2$ and $S_3$, provided the following relation below holds:

$$S_1 > S_2 > S_3.$$

The quantum well structure is disordered by thermal processing after the ion implantation. The degree of disordering varies depending on the dose level of the particular region. The disordering of a quantum well structure by the ion implantation and thermal processing is described in: Masashi Uematsu & Fumihiko Yamagawa, "Compositional disordering of Si-implanted GaAs/AlGaAs superlattices by rapid thermal annealing", JPN. J. Appl. Phys. Vol. 26, No. 8, August 1987, pp. L1407–L1409.

FIGS. 1e through 1h show the steps after completion of the ion implantation.

Figure 1E:
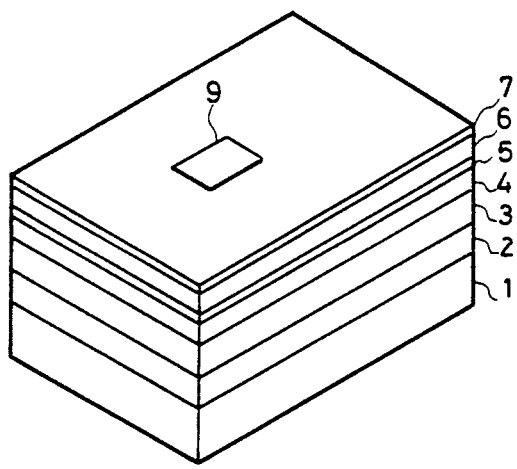
Figure 1F:
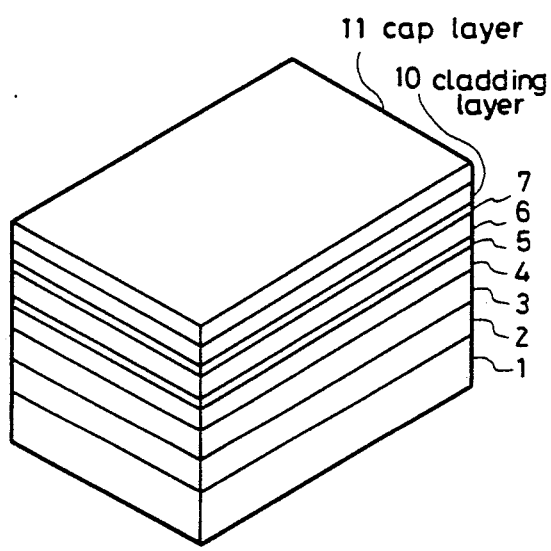
Figure 1G:
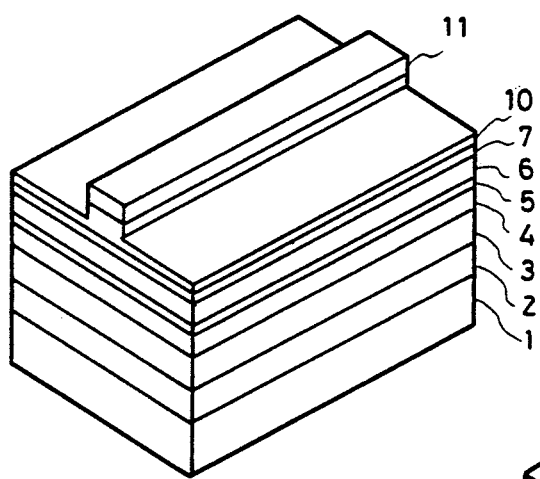
Figure 1H:
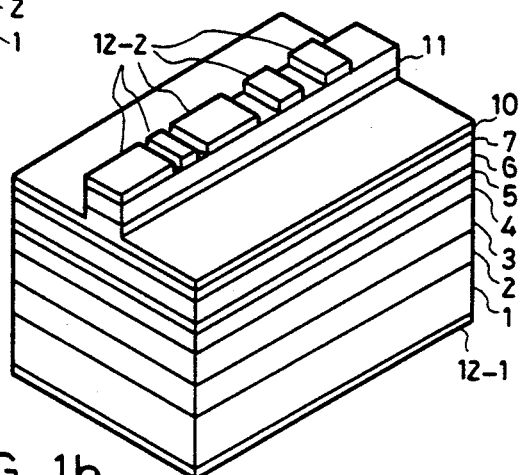

In the steps after the ion implantation, a grating is formed on the surface of the guiding layer 7 corresponding to the position where a DBR region is to be formed as shown in FIG. 1e. Then, as shown in FIG. 1f, a cladding layer 10 and a cap layer 11 are grown, and etched in a mesa structure as shown in FIG. 1g. Electrodes 12-1, 12-2 are then formed as shown in FIG. 1h. As the temperature rises while the cladding layer 10 and the cap layer 11 are grown, the heat is used for the thermal processing subsequent to the ion implantation.

Figure 2:
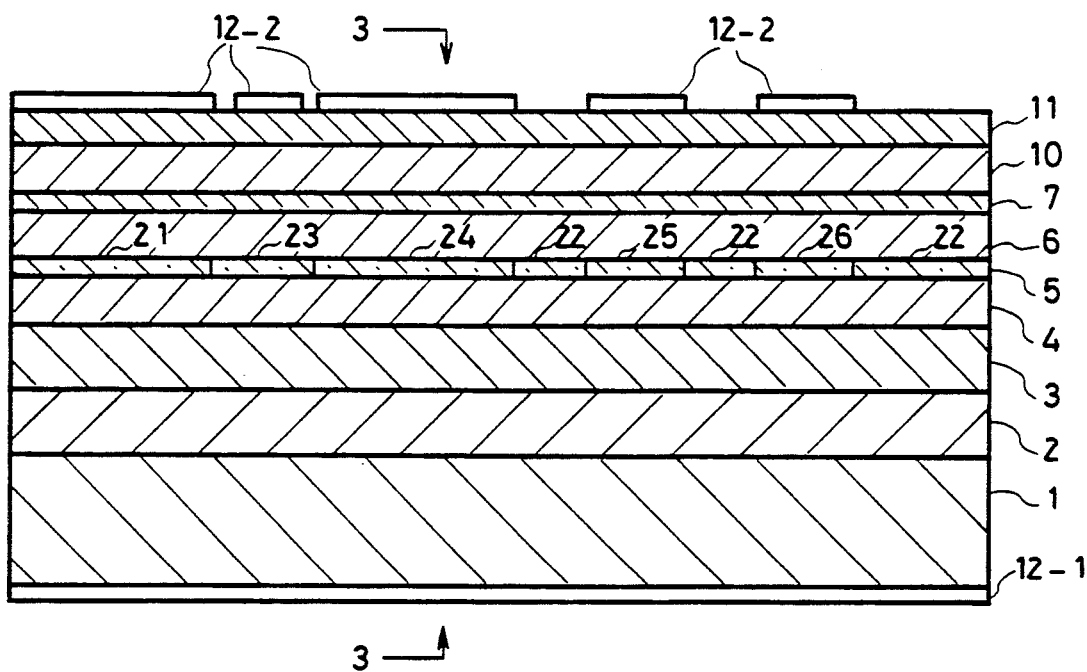
FIG. 2 is a longitudinal cross sectional view of the first embodiment.
Figure 3:
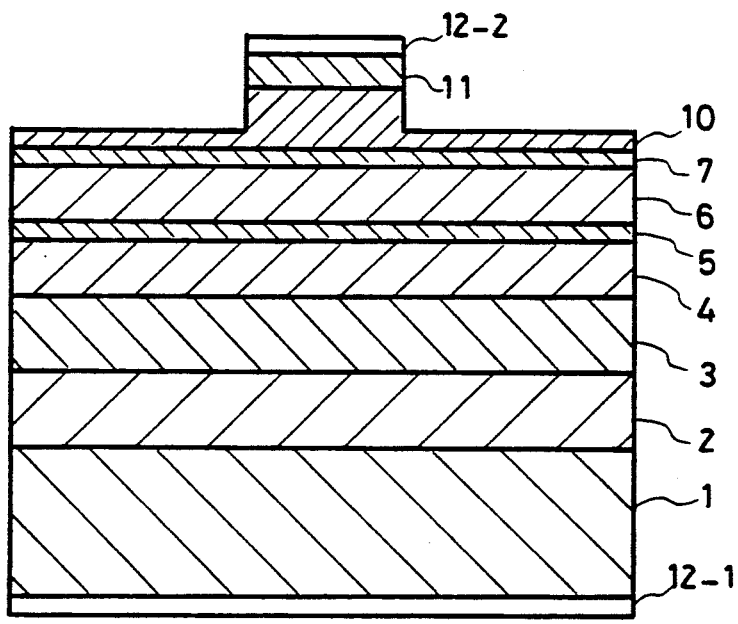
FIG. 3 is a cross sectional view of the first embodiment along the line 3—3 of FIG. 2.

FIG. 2 shows a cross section of the semiconductor optical device in the longitudinal direction of the mesa structure while FIG. 3 shows the cross section along the line 3—3 in FIG. 2.

The semiconductor optical device is obtained by using the quantum well structure which has not been disordered as an active region 21, forming a waveguide 22 on the waveguide region, a phase control region 23, a DBR region 24 and a PM modulation region 25 on the refractive index control region, and an AM modulation region 26 on the absorption control region.

Figure 4A:
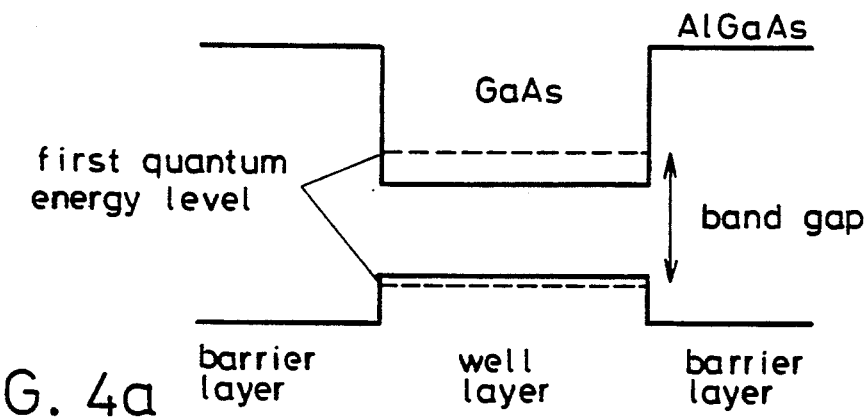
FIGS. 4a-4d are graphs showing the changes in energy band caused by disordering.
Figure 4B:
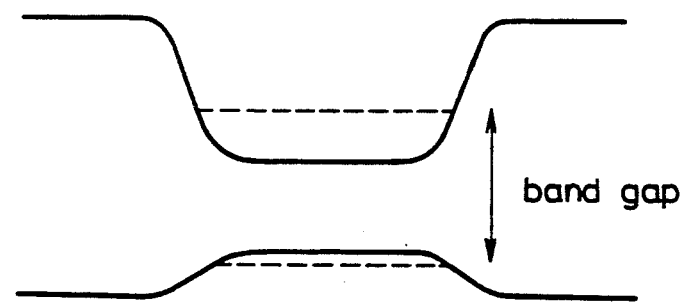
Figure 4C:
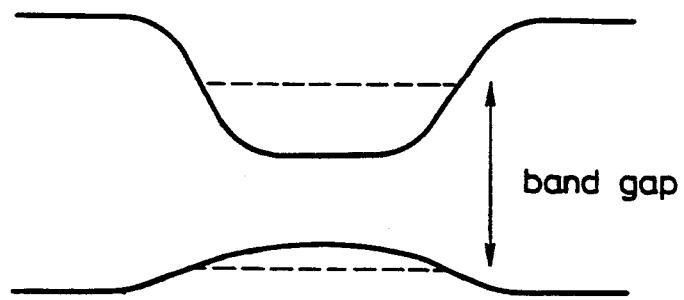
Figure 4D:
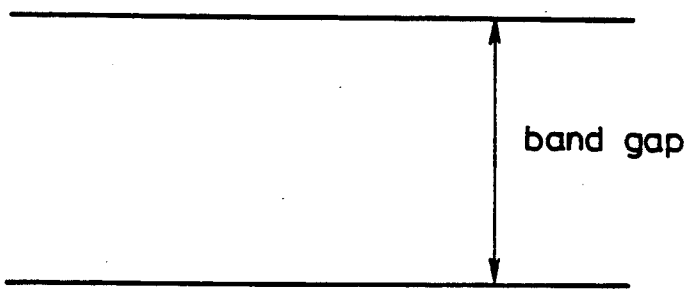

FIGS. 4a-4d show the changes in the energy band caused by disordering. FIG. 4a shows the state prior to disordering, FIGS. 4b and 4c show the states where disordering has progressed, and FIG. 4d shows the state where the disordering is completed. As the disordering progresses, the effective width of the well decreases, the first quantum energy level changes, and the band gap increases.

The region which is not disordered maintains the band gap of epitaxial growth. This region is used as the active region 21. The frequency oscillated by the region 21 is determined by the band gap thereof.

The band gap is expanded by disordering in the absorption control region, and the absorption edge is slightly shifted toward the side of the short wavelength. This in turn shifts the absorption edge corresponding to the band gap toward the short wave from the oscillation wavelength of the region 21. Under the normal state, it becomes transparent. But if electric current or voltage is applied on the region, the edge is shifted toward the long wave side, and the region may be used as an AM modulation region 26 using the changes in absorption coefficient.

As the dose level of the refractive index control region is larger than that of the absorption region, that region is subjected to a large degree of disordering. The band gap thereof is far greater than that of the absorption coefficient control region, and thus is less susceptible to changes in an absorption coefficient by electric current or voltage. When electric current or voltage is applied, however, the refractive index is changed due to the effect of plasma, Stark shift, etc. Utilizing such changes in the refractive index, the region may be used as the phase control region 23, the DBR region 24, and the PM modulation region 25.

Disordering progresses in the waveguide region further to increase the band gap. The absorption edge shifts toward the side of shorter wave, and the waveguide loss becomes smaller. The region may, therefore, be used as the waveguide 22.

The active region 21, the phase control region 23, the DBR region 24 and the structure neighboring them form a frequency tunable DBR laser, the AM modulation region 26 and the structure neighboring it forms an AM modulator, and the PM modulation region 25 and the structure neighboring it form a PM modulator. The operation of the frequency tunable DBR laser is described in detail in S. Murata, I. Mito and K. Kobayashi, "Over 720 GHz (5.8 nm) frequency tuning by a 1.5 $\mu$m DBR laser with phase and Bragg wavelength control regions" Electronics Lett., Vol. 23, No. 8, Apr. 9, 1987.

Figure 5:
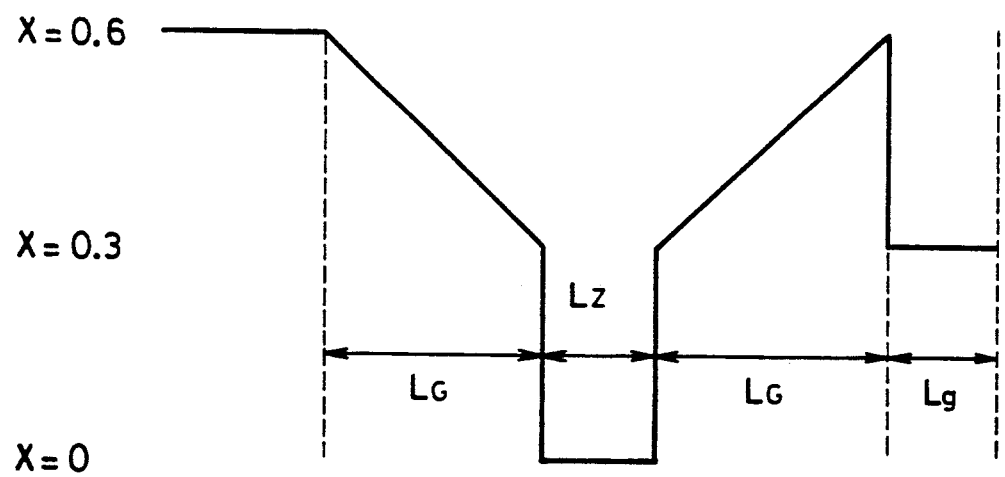
FIG. 5 is a graph showing Al mole fraction of a quantum well structure.

FIG. 5 shows the Al mole fraction of the quantum well structure of the semiconductor optical device which was actually manufactured.

In this embodiment, GaAs was used as the active layer 5 while Al Ga As was used as the GRIN layers 4, 6 and the guiding layer 7. The width Lz of the active layer 5 (quantum well width) was 7.5 nm, the width L of the GRIN layers 4, 6 was 150 nm and the width Lg of the guide layer 7 was 50 nm. Using Si as the implantation ion, the quantum well structure was implanted with ions under the following conditions:

(1) Waveguide region:
implantation energy: 100 KeV,
dose levels: $S_1 = 1 \times 10^{12} - 1 \times 10^{15}$ cm$^{-2}$.

(2) Refractive index control region, absorption coefficient control region:
implantation energy: 100 KeV
dose levels: $S_2, S_3 = 1 \times 10^{11} - 1 \times 10^{13}$ cm$^{-2}$.

The region was processed as shown in FIGS. 1e through 1h to form the semiconductor optical devices shown in FIGS. 2 and 3, and their operations were confirmed. The temperature of the second epitaxy step (FIG. 1f) was 770° C. in 40 minutes.

The table below shows the result of measurement of waveguide losses against Si dose levels.

| Si dose level | waveguide loss (cm$^{-1}$) |
| --- | --- |
| $1.5 \times 10^{13}$ cm$^{-2}$ | 5.0 |
| $1.0 \times 10^{13}$ cm$^{-2}$ | 4.4 |
| $0.7 \times 10^{13}$ cm$^{-2}$ | 12.0 |

The values in the table were obtained when measurement was taken under the following conditions:
Substrate 1: GaAs
Buffer layer 2: n-type GaAs
Cladding layer 3: n-type Al$_{0.6}$Ga$_{0.4}$As
GRIN layer 4: undoped Al$_x$Ga$_{1-x}$As.
The layer obtained by disordering the undoped quantum well layer.
GRIN layer 6: undoped Al$_x$Ga$_{1-x}$As
Guiding layer 7: undoped Al$_{0.3}$Ga$_{0.7}$As
Cladding layer 10: p-type Al$_{0.6}$Ga$_{0.4}$As
Wave guide width: 6 $\mu$m
Frequency used in measuring: 845 nm.

The above embodiment shows a case where the degree of disordering was controlled by the dose level of ion implantation, but it may be controlled by the implanted ion species. For instance, P. Mei, T. Ven-katesan, S. A. Schwarz, N. G. Stoffel, J. P. Harbison, D. L. Hart and L. A. Florez taught, in their paper titled "Comparative studies of ion-induced mixing of GaAs-AlAs superlattices", Appl. Phys. Lett. 52 (18), May 2, 1988, pp. 1487-1479, that the degree of disordering was controlled by selecting the species of implantation ions similar thermal process was carried out.

The quantum well structure shown in FIG. 5 of the quantum well width Lz=7.5 nm, the width of the GRIN layer 4, 6 Lg=100 nm, the width of the guide layer 7 Lg=50 nm were implanted under the following conditions:

(1) Waveguide region
Species of implanted Ions: Si
Implantation energy: 75 KeV
Dose level $S_1$: $1 \times 10^{12} - 1 \times 10^{14}$ cm$^{-2}$.

(2) Refractive index control region, absorption coefficient region:
  Species of implanted ions: As
  Implantation energy: 400 KeV
  Dose level $S_2$ $S_3$: $1 \times 10^{12} - 1 \times 10^{14}$ cm$^{-2}$.

FIGS. 6a–6f show the manufacturing process of the second embodiment of this invention. A sample product using GRIN-SCH-SQW structure as the quantum well structure will be described below.

As shown in FIG. 6a, an n-type buffer layer 2, an n-type cladding layer 3, a GRIN layer 4, a SQW active layer 5, a GRIN layer 6 and a guide layer 7 where formed epitaxially in this order on an n-type GaAs substrate 1. The composition of the layers from the n-type cladding layer 3 to the guide layer was $Al_x Ga_{1-x}As$, and the mole fraction x and the thickness thereof are as follows:
  Cladding layer 3: x=0.6, 1.5 μm
  GRIN layer 4: x=0.6–0.3, 0.15 μm
  SQW active layer 5: x=0, 8 nm
  GRIN layer 6: x=0.3–0.6, 0.15 μm
  Guiding layer 7: x=0.3, 0.05 μm.

Then, as shown in FIG. 6b, ions were implanted on the two regions which were to be facets. The distance a between the two regions was 1000 μm. Si ions were used, the implantation energy was 100 KeV, and the dose level was $1 \times 10^{13}$ cm$^{-2}$.

The guide layer 7 was etched as shown in FIG. 6c to form a rib waveguide 20. Then, a p-type cladding layer 10 and a p-type cap layer 11 were grown as shown in FIG. 6d. Their mole fractions x and thickness were respectively as follows:
  Cladding layer 10: x=0.6, 1.5 μm
  Cap layer 11: x=0, 0.3 μm The high temperature during the growth of the cladding layer 10 and the cap layer 11 was used for thermal processing after implantation.

As shown in FIG. 6e, the cap layer 10 and the cladding layer 11 were partially etched to form a ridge structure for current confinement, and an upper electrode 12-2 was formed after SiO$_2$ insulating layer 13 had been deposited. A lower electrode 12-1 was formed on the reverse surface of the substrate 1.

Lastly, as shown in FIG. 6f, the upper electrode 12-1 was removed correspondingly to the region which was to be a facet as shown in FIG. 6b, and cleaved to form disordered regions having the width of 50 μm on both sides of the semiconductor laser. The distance b between the cleaved facets was 1100 μm.

A device shown in FIG. 6f was cleaved inside the disordered two regions for comparison. The distance c between cleaved facets was 900 μm.

Figure 7:
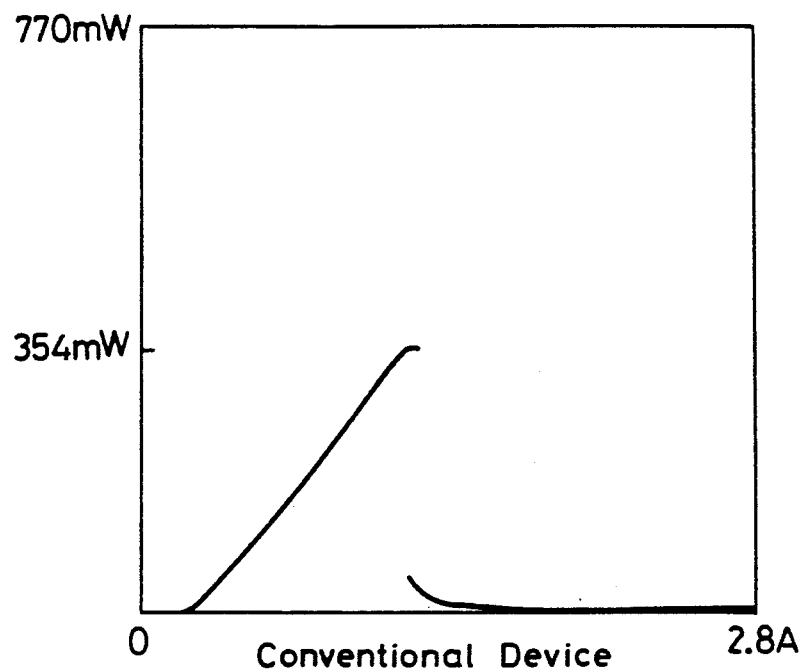
FIG. 7 is a graph showing an example of output power against the injected current of a comparison device.
Figure 8:
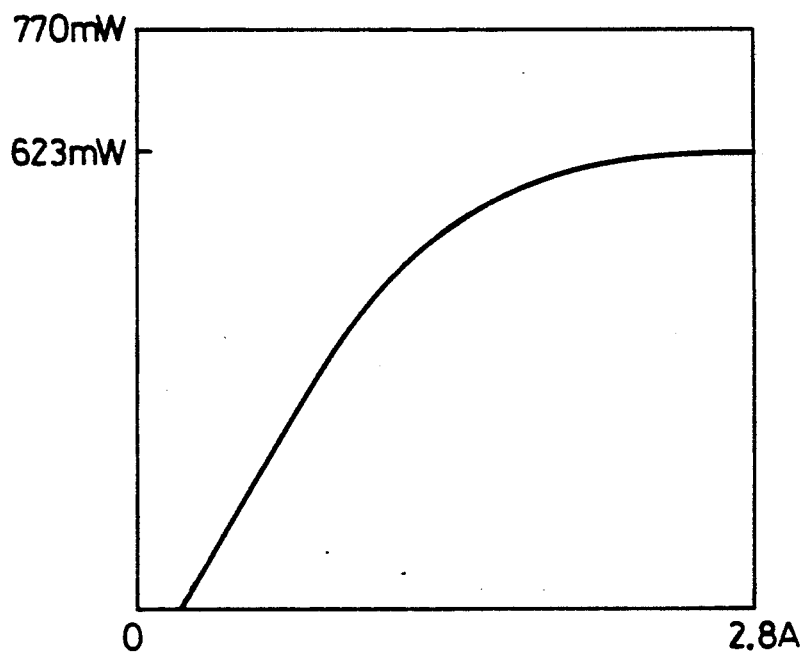
FIG. 8 is a graph showing an example of output power against injected current of the second embodiment device.
Figure 9:
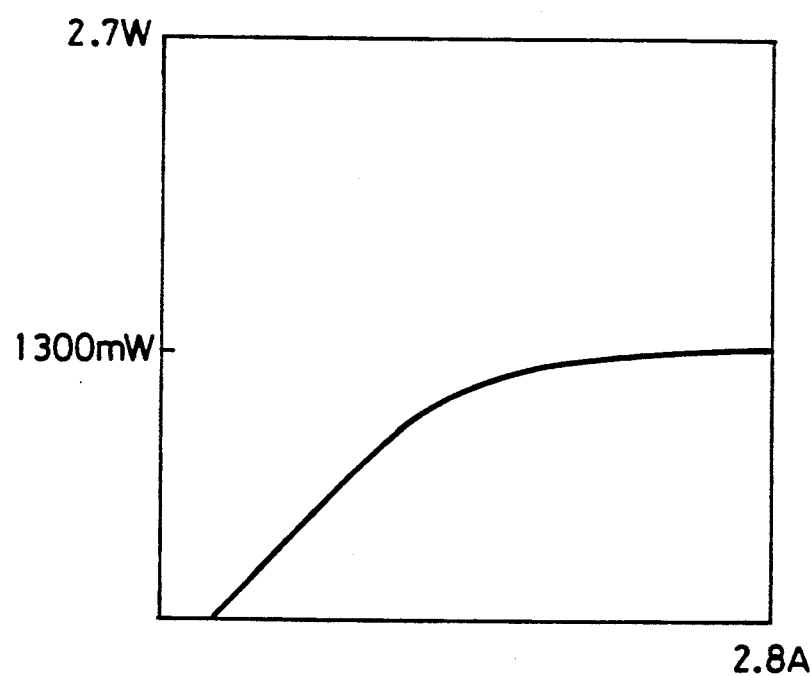
FIG. 9 is a graph showing another example of output power against injected current of the second embodiment device.
Figure 10A:
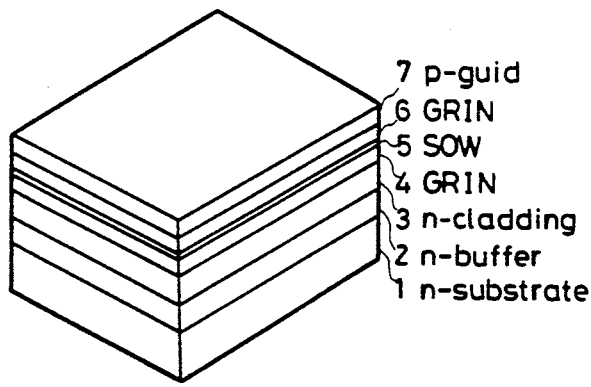
FIGS. 10a-10f are views showing the manufacturing process of the third embodiment semiconductor optical device according to this invention where a DBR laser is manufactured.
Figure 10B:
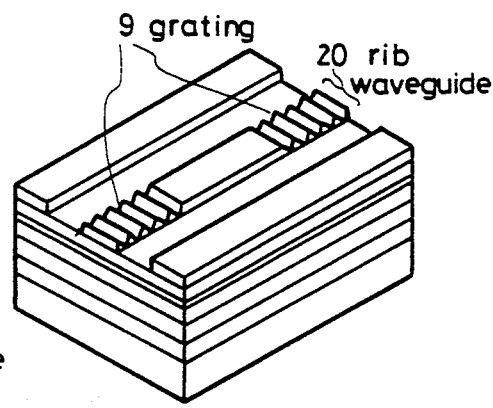
Figure 10C:
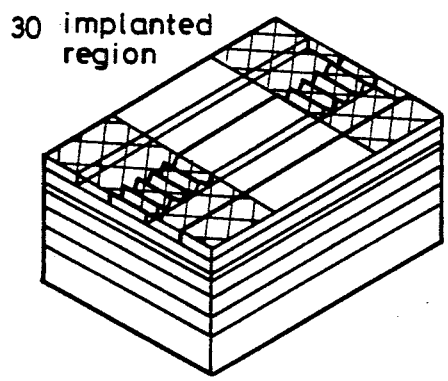
Figure 10D:
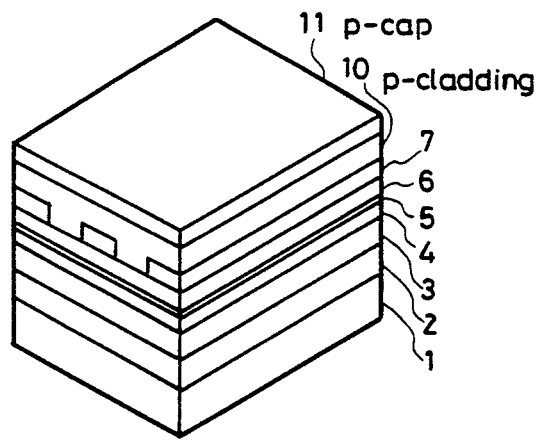
Figure 10E:
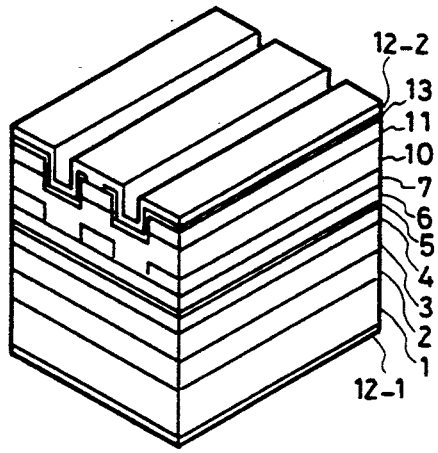
Figure 10F:
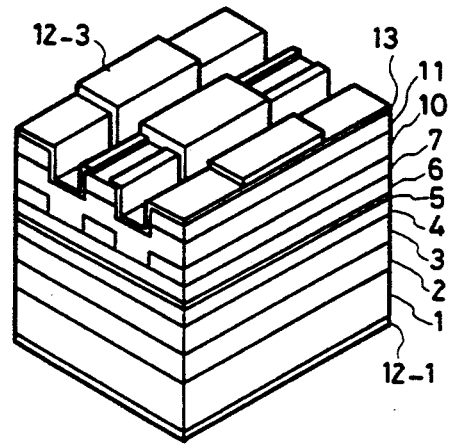
Figure 11A:
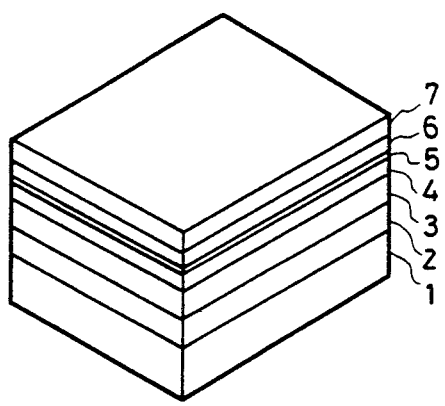
FIGS. 11a-11f are views showing the manufacturing process of the fourth embodiment semiconductor optical device where according to this invention where a frequency tunable DBR laser is manufactured.
Figure 11B:
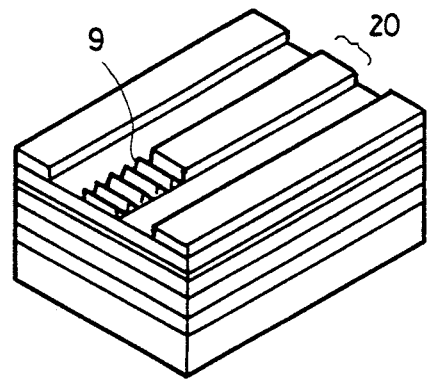
Figure 11C:
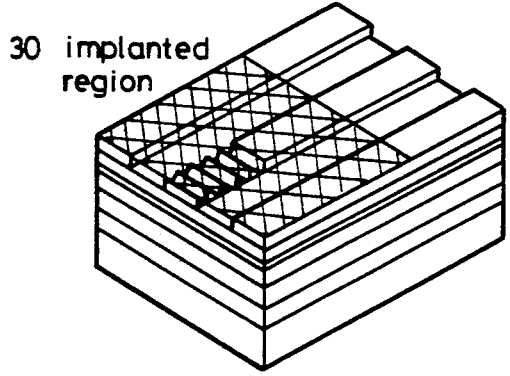
Figure 11D:
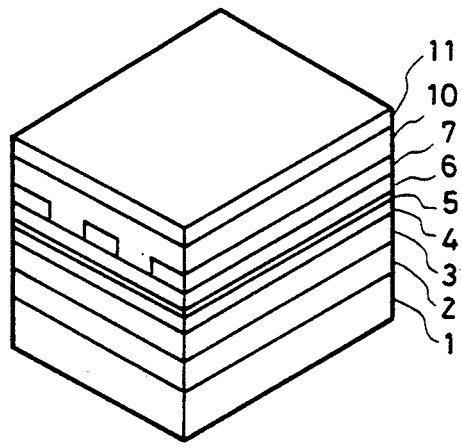
Figure 11E:
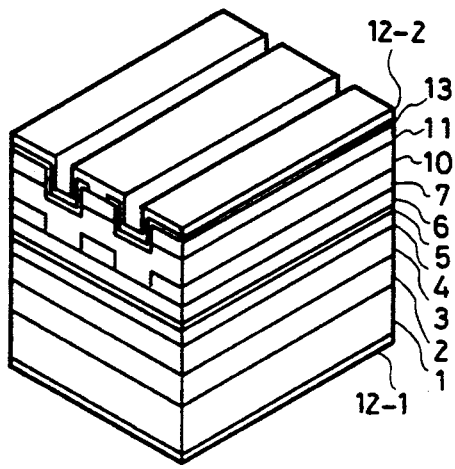
Figure 11F:
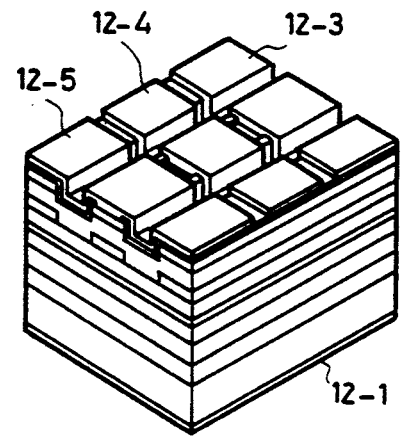
Figure 12A:
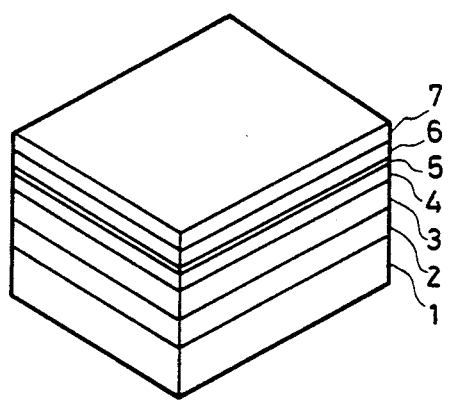
FIGS. 12a-12f are views showing the manufacturing process of the fifth embodiment semiconductor optical device according to this invention where an ROR laser is manufactured.
Figure 12B:
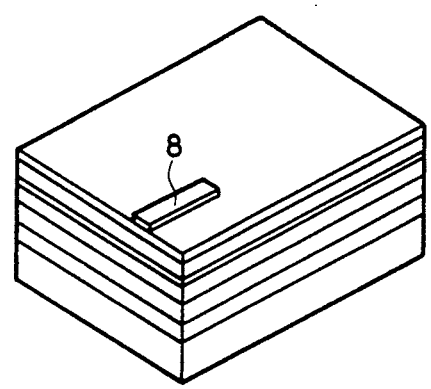
Figure 12C:
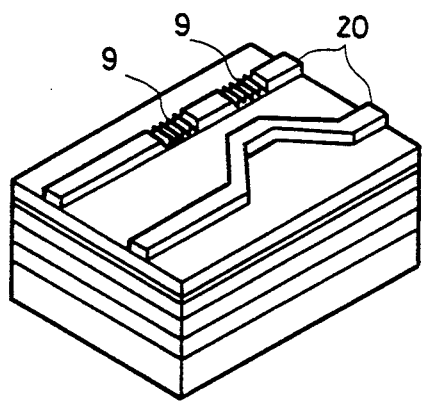
Figure 12D:
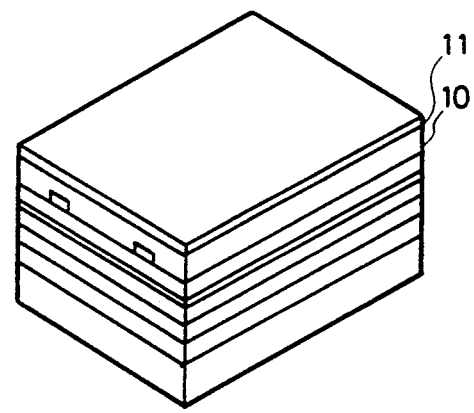
Figure 12E:
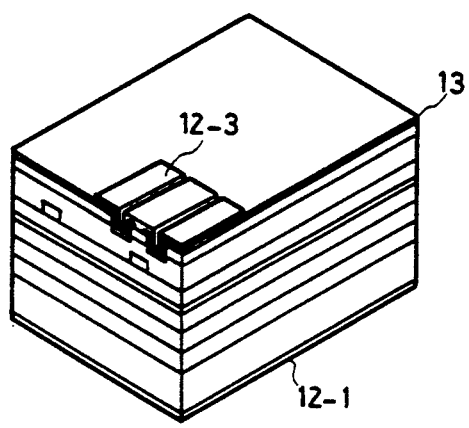
Figure 12F:
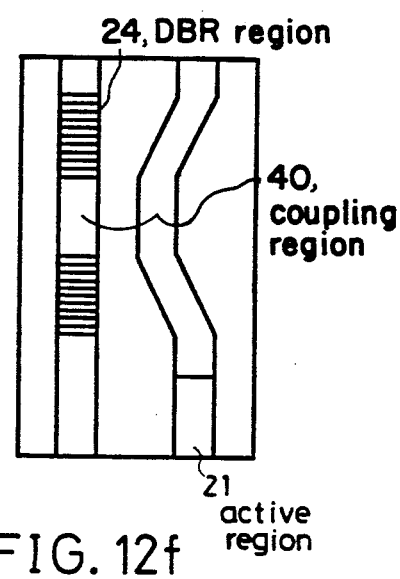
Figure 13A:
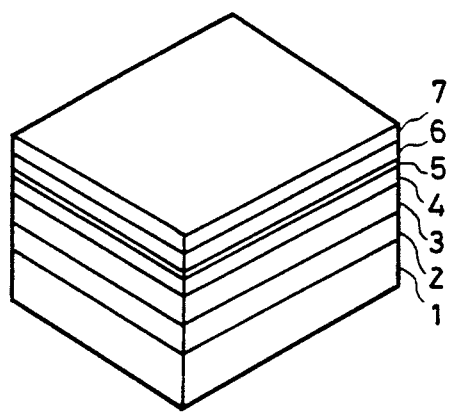
FIGS. 13a-13f are views showing process of the sixth embodiment semiconductor optical device according to this invention where a frequency tunable ROR laser is manufactured.
Figure 13B:
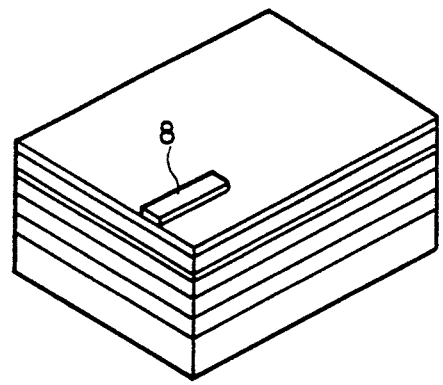
Figure 13C:
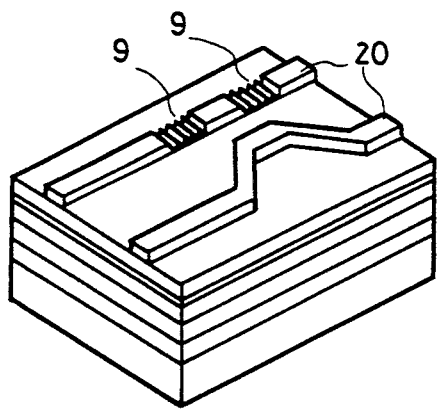
Figure 13D:
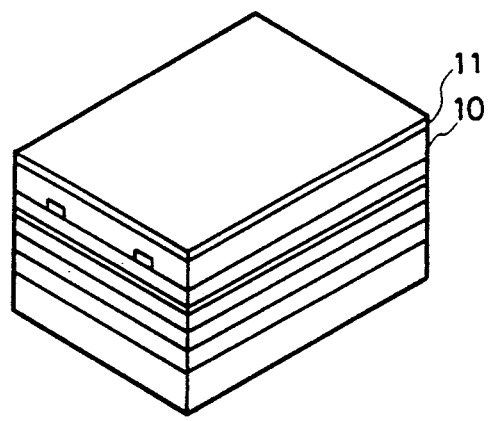
Figure 13E:
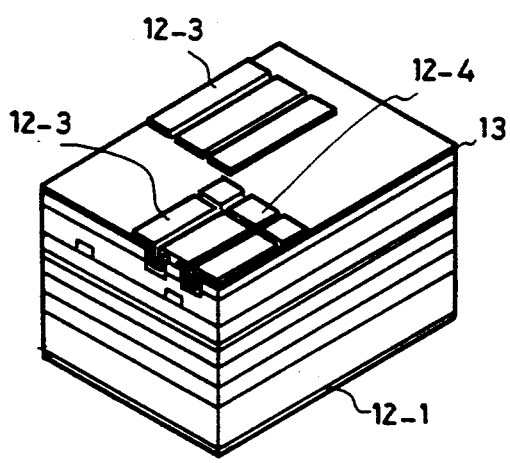
Figure 13F:
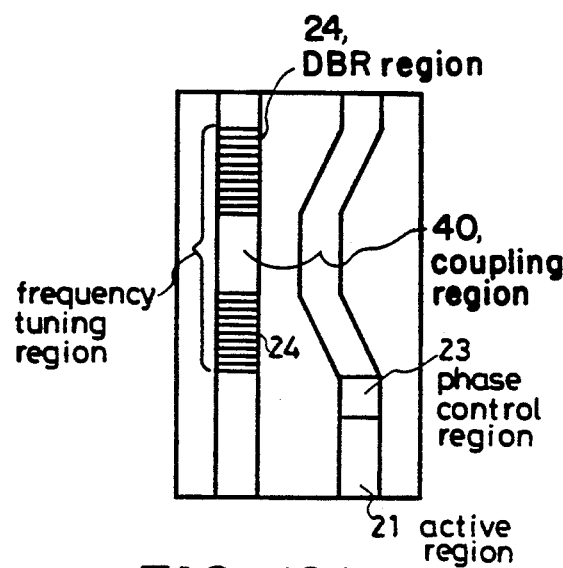

FIGS. 7 through 9 show the result of measurement of characteristics of the thus obtained embodiment and the comparison.

The graphs in FIGS. 7 and 8 show the relation of the output power and the injected current measured in the comparison and the embodiment.

Pulsed light was generated from this embodiment and the comparison devices at 20° C., in the time width of 400 ns and at the duty ratio of 0.1%. As a result, COD was caused when the output reached 354 mW in the comparison device. But in this embodiment, the output was saturated with the heat generated at 623 mW causing no COD.

As stated above, the cavity length was 1100 μm in this embodiment, and was 900 μm in the comparison device. The effect of disordering was quite obvious even though the cavity length differed.

FIG. 9 shows an example of measurement of output power in relation to injected current when one of the facets was covered with an anti-reflection coating while the other facet was covered with a high reflection coating. The anti-reflection coating used had the refractive index of 1%, and the high reflection coating 97%. The conditions in temperature and light emission were the same as above. The output in this example was saturated at 1.3 W and no COD was caused.

As shown in FIGS. 4a–4d, when disordering was fully completed, the band gap increased up to the value of the barrier layer. If facets of a quantum well structure are disordered, the band gap in the regions will increase to eliminate absorption completely.

FIGS. 10 through 13 show the manufacturing process of a DBR laser, a frequency tunable DBR laser, a ROR laser, and a frequency tunable ROR laser as the third to the six embodiments according to this invention. The ROR laser and the frequency tunable ROR laser are shown in plane view in FIGS. 12f and 13f.

In the manufacturing process of a DBR laser, in a manner similar to those shown in FIGS. 1a–1h, an active region and DBR regions were formed within the rib waveguide 20. DBR regions were provided on both sides of the active region in this embodiment. A grating was provided on the DBR region and the quantum well structure thereof was disordered. The upper electrode 12-2 was removed except for the active region, and the remaining portion was used as a driving electrode 12-3.

In the process for the frequency tunable DBR laser, an active region, a phase control region and a DBR region were formed within the rib waveguide 20. The upper electrode 12-2 was split to form a driving electrode 12-3, a phase control electrode 12-4 and a frequency tuning electrode 12-5 in respective regions.

In the process for the ROR laser, the active region 21 and the DBR region were formed separately in different waveguides and a coupling region 40 was provided in a manner to couple propagated lights between the separate waveguides. The DBR regions 24 were provided on both sides of the coupling region 40.

In order to make the frequency oscillated by the ROR laser tunable, the waveguide on the side of the active region 21 is provided with a phase control region 23, the active region 21 with a driving electrode 12-3, the phase control region 23 with a phase control electrode 12-4 and the DBR region 24 and the regions therebetween with the frequency tuning electrode 12-5.

ROR such as above is described in detail in Rudolf F. Kazarinov, Charles H. Henry, and N. Anders Olsson, "Narrowband resonant optical reflectors and resonant transformers for laser stabilization and wavelength division multiplexing", IEEE Journal of Quantum Electronics, Vol.QE-23, No. 9, September, 1987. The semiconductor laser using an ROR as an extra-cavity is described in detail in N. A. Olsson, C. H. Henry, R. F. Kazarinov, H. J. Lee, B. H. Johnson and K. J. Orlowsky, "Narrow linewidth 1.5 μm semiconductor laser with a resonant optical reflector", Appl. Phys. Lett. 51(15), October 1987. As to the technology for integrating semiconductor laser with RORs on the same substrate, the present applicant has filed a patent application (JPA Sho 63-218981).

Although the above embodiments describe the cases where $^{28}$Si was used as ions to be implanted, other ions may be used to realize this invention process.

So far as a quantum well structure is used, the semiconductor laser may have any structure for confining light or other purposes. Therefore, this invention process is applicable to the manufacturing steps for broad area semiconductor lasers or for laser arrays.

What I claim is:

1. A manufacturing process for a semiconductor optical device comprising the steps of:

forming semiconductor layers including at least a quantum well structure layer and a rib waveguide layer, on a substrate by a first epitaxy step;

removing portions of the waveguide layer to form a rib waveguide;

disordering said quantum well over an area larger than a wavelength of light of a laser, the remaining area being used as an active region; and subsequent to said disordering step, embedding said rib waveguide with a layer formed by a second epitaxy step.

2. The process as in claim 1 wherein the quantum well structure comprises a single quantum well.

3. The process as in claim 1 wherein said disordering is conducted by ion implantation and thermal processing.

* * * * *